(12) United States Patent
Shaw et al.

(10) Patent No.: US 12,142,460 B2
(45) Date of Patent: *Nov. 12, 2024

(54) CONTROL OF PLASMA SHEATH WITH BIAS SUPPLIES

(71) Applicant: Advanced Energy Industries, Inc., Denver, CO (US)

(72) Inventors: Denis Shaw, Fort Collins, CO (US); Kevin Fairbairn, Los Gatos, CA (US); Daniel Carter, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/450,635

(22) Filed: Aug. 16, 2023

(65) Prior Publication Data

US 2023/0395354 A1 Dec. 7, 2023

Related U.S. Application Data

(63) Continuation of application No. 17/692,880, filed on Mar. 11, 2022, now Pat. No. 11,842,884, which is a
(Continued)

(51) Int. Cl.
 *H01J 37/32* (2006.01)
 *H01L 21/67* (2006.01)

(52) U.S. Cl.
 CPC .. *H01J 37/32174* (2013.01); *H01J 37/32412* (2013.01); *H01J 37/32477* (2013.01);
(Continued)

(58) Field of Classification Search
 CPC .......... H01J 37/32174; H01J 37/32412; H01J 37/32477; H01J 37/32559;
(Continued)

(56) References Cited

U.S. PATENT DOCUMENTS 11,282,677 B2 * 3/2022 Shaw ................ H01J 37/32412
2012/0318456 A1 * 12/2012 Brouk ............... H01J 37/32935
315/111.21
(Continued)

FOREIGN PATENT DOCUMENTS

JP 2015115564 A 6/2015
JP 2015534718 B 4/2018

OTHER PUBLICATIONS

Taiwanese Preliminary Examination and Search Report of Taiwanese Patent Application No. 111150645 dated Oct. 18, 2023.
(Continued)

*Primary Examiner* — Renan Luque
(74) *Attorney, Agent, or Firm* — Neugeboren O'Dowd PC

(57) ABSTRACT

Systems and methods for plasma processing are disclosed. An exemplary system may include a plasma processing chamber including a source to produce a plasma in the processing chamber and at least two bias electrodes arranged within the plasma processing chamber to control plasma sheaths proximate to the bias electrodes. A chuck is disposed to support a substrate, and a source generator is coupled to the plasma electrode. At least one bias supply is coupled to the at least two bias electrodes, and a controller is included to control the at least one bias supply to control the plasma sheaths proximate to the bias electrodes.

20 Claims, 12 Drawing Sheets

Related U.S. Application Data continuation of application No. 16/896,709, filed on Jun. 9, 2020, now Pat. No. 11,282,677, which is a continuation of application No. 16/194,104, filed on Nov. 16, 2018, now Pat. No. 10,707,055.

(60) Provisional application No. 62/588,224, filed on Nov. 17, 2017.

(52) U.S. Cl.
CPC .. *H01J 37/32559* (2013.01); *H01J 37/32568* (2013.01); *H01J 37/32706* (2013.01); *H01J 37/32935* (2013.01); *H01L 21/67109* (2013.01)

(58) Field of Classification Search
CPC ........... H01J 37/32568; H01J 37/32706; H01J 37/32935; H01J 37/32137; H01J 37/32532; H01J 37/32715; H01L 21/67109; H01L 21/6833
See application file for complete search history.

(56) References Cited

U.S. PATENT DOCUMENTS

| | | | |
|---|---|---|---|
| 2017/0018411 A1* | 1/2017 | Sriraman | H01J 37/32715 |
| 2021/0202209 A1 | 7/2021 | Van Zyl et al. | |
| 2023/0268162 A1 | 8/2023 | Van Zyl et al. | |
| 2023/0395355 A1 | 12/2023 | Shaw et al. | |

OTHER PUBLICATIONS

Japan Patent Office, Notice of reasons for rejection regarding Japan Patent Application No. 2020-545048, Nov. 14, 2023, p. 6.

Fiona Doherty, Patent Cooperation Treaty, International Preliminary Report On Patentability, The International Bureau of WIPO, Switzerland.

National Intellectual Property Administration of The People's Republic of China, Chinese Office Action, Apr. 21, 2023, China.

EPO, Communication pursuant to Article 94(3) EPC regarding Application No. 18878531.5, Apr. 18, 2024, 6 pages, Published in EP.

Hammond, Crystal L., Office Action issued in U.S. Appl. No. 17/181,382, filed May 9, 2024, 119 pages, Published in US.

KIPO, Notice of Ground of Rejection issued in Application No. 10-2020-7017361, Mar. 27, 2024, 22 pages, Published in KR.

Le, Tung X, Office Action issued in U.S. Appl. No. 18/450,652, filed Apr. 1, 2024, 39 pages, Published in US.

Luque, Renan, Final Office Action issued in U.S. Appl. No. 17/902,987, filed Jun. 12, 2024, 40 pages, Published in US.

EPO, Extended European Search Report issued in EP Application No. 24170540.9, Jul. 23, 2024.

* cited by examiner

CONTROL OF PLASMA SHEATH WITH BIAS SUPPLIES

CLAIM OF PRIORITY UNDER 35 U.S.C. § 120

The present application for patent is a Continuation of patent application Ser. No. 17/692,880 entitled "SPATIAL MONITORING AND CONTROL OF PLASMA PROCESSING ENVIRONMENTS" filed Mar. 11, 2022 which is a Continuation of patent application Ser. No. 16/896,709 entitled "SPATIAL MONITORING AND CONTROL OF PLASMA PROCESSING ENVIRONMENTS" filed Jun. 9, 2020 and issued as U.S. Pat. No. 11,282,677 on Mar. 22, 2022 which is a Continuation of patent application Ser. No. 16/194,104 entitled "SPATIAL AND TEMPORAL CONTROL OF ION BIAS VOLTAGE FOR PLASMA PROCESSING" filed Nov. 16, 2018 and issued as U.S. Pat. No. 10,707,055 on Jul. 7, 2020, which claims priority to Provisional Application No. 62/588,224 entitled "SPATIAL AND TEMPORAL CONTROL OF ION BIAS VOLTAGE FOR PLASMA PROCESSING" filed Nov. 17, 2017, all of which are assigned to the assignee hereof and hereby expressly incorporated by reference herein.

BACKGROUND

Field

The present disclosure relates generally to plasma processing. In particular, but not by way of limitation, the present disclosure relates to systems, methods and apparatuses for modifying a plasma process environment with power supplies.

Background

A challenge for plasma processing chambers is controlling the uniformity of the plasma sheath above the substrate, particularly around the edge of the substrate. Discontinuities caused by the substrate edge, the edge of the buried electrical plane, the isolating ring and other chamber related artifacts can impact the sheath uniformity, which changes the trajectory of ions relative to the substrate, and as a consequence, processing of the substrate may be adversely affected.

Prior attempts have used physical changes in the substrate holder, chamber shape, and other physical geometries to try to alleviate these challenges. But these approaches are static, inflexible, and otherwise deficient.

SUMMARY

An aspect may be characterized as a system for plasma processing. The system includes a plasma processing chamber that includes a source to provide a plasma in the processing chamber; at least two bias electrodes arranged within the plasma processing chamber to control plasma sheaths proximate to the bias electrodes; and a chuck disposed to support a substrate. The system also includes at least one bias supply coupled to the at least two bias electrodes and a controller to control the at least one bias supply to apply an asymmetric periodic voltage waveform to each of the at least two bias electrodes to control the plasma sheaths proximate to the bias electrodes.

Another aspect may be characterized as a method for processing a substrate in a plasma processing chamber. The method includes producing a plasma in the plasma processing chamber; applying an asymmetric periodic voltage waveform to each of a plurality of zones in the plasma processing chamber with a corresponding plurality of bias supplies; and adjusting one or more characteristics of the asymmetric periodic voltage waveforms to alter corresponding portions of a plasma sheath.

DETAILED DESCRIPTION

Figure 1:
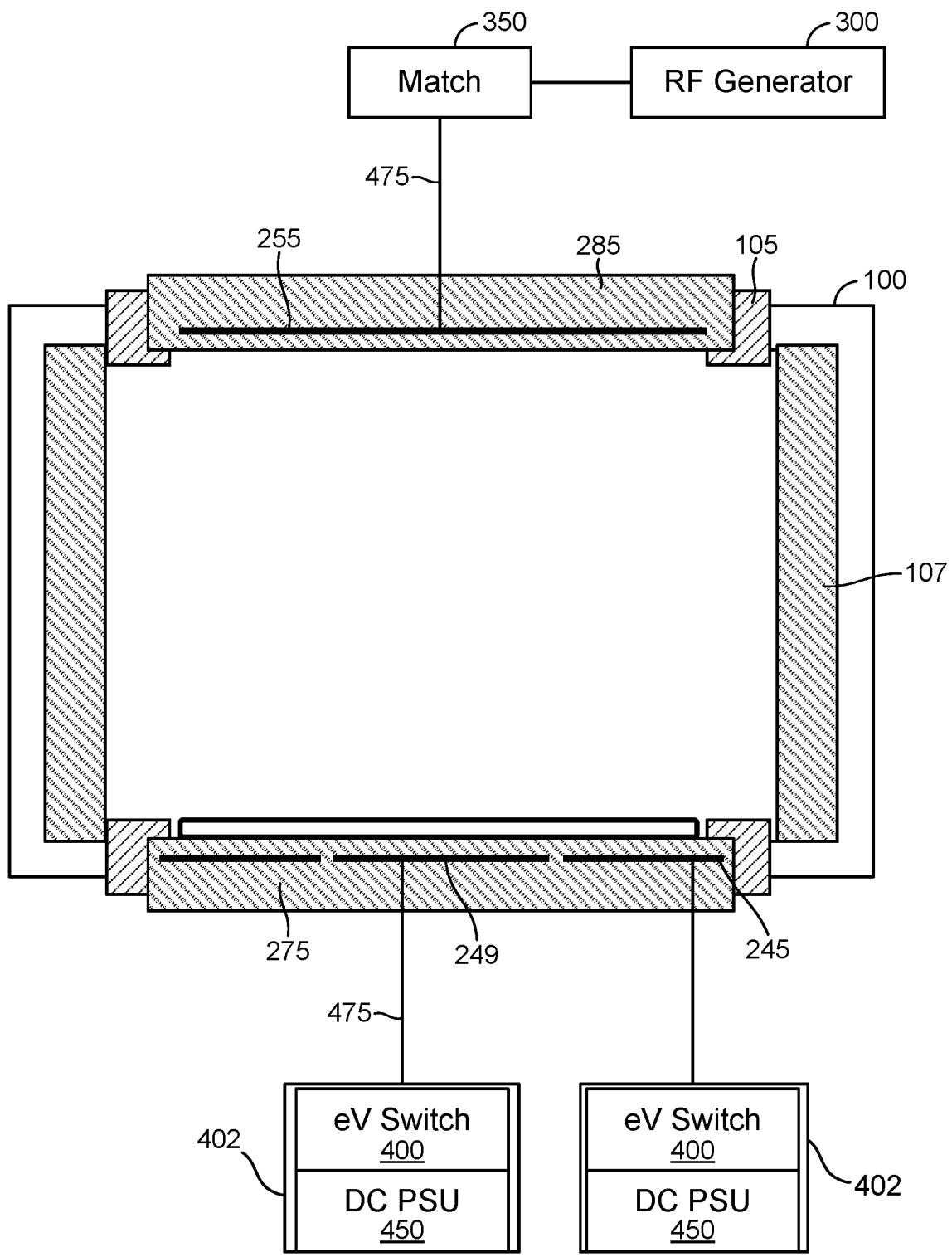
FIG. 1 is a diagram depicting a plasma processing system with a plurality of bias zones.

This disclosure generally describes systems, methods, and apparatus to control the uniformity and intensity of capacitively (or inductively) coupled plasmas both spatially and temporally.

The word "exemplary" is used herein to mean "serving as an example, instance, or illustration." Any embodiment described herein as "exemplary" is not necessarily to be construed as preferred or advantageous over other embodiments. And any reference in this specification to any prior publication (or information derived from it), or to any matter which is known, is not an acknowledgment or admission or any form of suggestion that the prior publication (or information derived from it) or known matter is conventional, routine, or forms part of the common general knowledge in the field of endeavor to which this specification relates.

As a preliminary note, the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While use cases in the following disclosure include wafer plasma processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to effect a surface change, subsurface change, deposition or removal by physical or chemical means.

This disclosure may, but need not, utilize plasma processing and substrate biasing techniques as disclosed in U.S. Pat. Nos. 9,287,092, 9,287,086, 9,435,029, 9,309,594, 9,767,988, 9,362,089, 9,105,447, 9,685,297, 9,210,790. The entirety of these patents are incorporated herein by reference.

For the purposes of this disclosure, "excitation sources," "source generators," "RF sources," or "RF power supplies" are those whose energy is primarily directed to generating and sustaining the plasma, while "bias supplies" are those whose energy is primarily directed to generating a surface potential for attracting ions and electrons from the plasma. Although the frequencies of the source generators and bias supplies vary depending upon a variety of factors (e.g., application-specific factors), in many embodiments, the source generator operates at frequencies of 13.56 MHz and greater and the bias supplies operate at frequencies less than 2 MHz (e.g., without limitation, between 2 MHz and 400 kHz). In other embodiments the frequency of the source supply is less than 13.56 MHz, and it is contemplated that the bias supply may operate at frequencies that exceed 2 MHz. In many applications, the frequency of the source supply is greater than the frequency of the bias supply.

Each of FIGS. 1-4 depicts an exemplary plasma processing system that includes a generic cylindrical symmetric plasma processing chamber 100 with top electrode 285 (e.g., cathode) and lower (substrate) electrode 275 (e.g., anode) of similar area. This simplification of the geometry of the plasma processing chamber 100 eases explanation but should not be a limitation on the various implementations of this disclosure. For instance, the plasma processing chamber 100 may have other than a cylindrical shape (e.g., the processing chamber 100 may have a rectangular shape) and may not be symmetric. In other embodiments, the top and lower electrodes 285, 275 may not have the same shape and/or size.

FIGS. 1-4 also show the electrodes 275, 285 as an insulator with electrical planes 245, 249, 255 buried within. However, in other embodiments, the electrodes 275, 285 may comprise a conductive material or a metal with an insulating coating. More generally, the electrodes 275, 285 can be implemented as any structure that is able to capacitively couple energy into the plasma (top electrode 285) or capacitively generate a bias voltage on the substrate 200 surface (lower electrode 275). Although FIGS. 1-4 depict RF power from a source generator being capacitively coupled to plasma within the plasma chamber 100, it should be recognized that RF energy may also (or alternatively) be inductively coupled from the source generator 300 to the plasma processing chamber 100. Thus, the energy coupling component may be an inductive element (e.g., a coil) instead of the electrical plane 255. In some embodiments, instead of utilizing a source generator (e.g., a source generator), or in addition to using a source generator, plasma is provided to the plasma chamber by a remote plasma source.

The substrate 200 can be any object or item and in some instances, surfaces, that are processed by a plasma to effect surface change, subsurface change, deposition or removal by physical or chemical means.

FIG. 1 illustrates a plasma processing chamber 100 with a top electrode 285 powered by a source generator 300 (also referred to as an "RF source") connected through a match 350 to an energy coupling component (e.g., the buried electrical plane 255) by cable 475 or other conductor. The top electrode 285 is isolated from a body of the plasma processing chamber 100 by an isolating ring 105. The inner walls of a vacuum wall are isolated from the plasma potential in this example by an isolating cylinder 107. The RF excitation from the top electrode 285 is used to generate and maintain the plasma and to control the plasma density. A substrate 200 is shown sitting on a lower electrode 275. This electrode 275 is isolated from the plasma chamber by an isolating ring 110. The present embodiment includes two bias supplies 402, which may each include a DC power supply unit (PSU) 450 and an eV switch 400.

A challenge for plasma processing chambers is controlling the uniformity of the plasma sheath above the substrate 200, particularly around the edge of the substrate. Discontinuities caused by the substrate edge, the edge of the buried electrical plane the isolating ring 110 and other chamber related artifacts can impact the sheath uniformity, and therefore, the processing uniformity of the substrate. Prior attempts used physical changes in the substrate holder, chamber shape, and other physical geometries to try to alleviate these challenges. In addition, many prior approaches operate with a symmetrical (e.g., sinusoidal) output (e.g., where a first half-cycle of the waveform has a corresponding symmetrical component in a last half-cycle of the waveform). But applying a sinusoidal waveform to a substrate induces a broad distribution of ion energies, which limits the ability of the plasma process to carry out a desired etch profile. This disclosure addresses these non-uniformities and deficiencies with a more dynamic and flexible approach.

In general, FIG. 1 depicts multiple bias supplies 402, and each bias supply 402 is coupled to a corresponding electrical plane to form multiple zones (also referred to herein as bias zones) within the plasma processing chamber 100. Although FIG. 1 depicts two zones, it should be recognized that embodiments may include many more than two zones. As shown in FIG. 1, one of the bias supplies 402 is coupled to a central electrical plane 249 and another bias supply 402 is connected to an outer buried electrical plane 245. Each of the bias supplies 402 can be controlled independently of the other bias supply. Using two buried planes 245, 249 and two bias supplies 402 allows non-uniform biasing across the electrode 275. For instance, a higher bias may be applied to the outer buried plane 245 than to the center buried plane 249, or vice versa. Alternatively, different pulsing regimes can be applied to each buried plane 245, 249. While non-uniform biasing can be applied, the result may be a uniform surface potential on the substrate 200. In other words, this multi-buried-plane method can be used to mitigate non-uniformities in the plasma, substrate, etc., and thereby achieve a uniform plasma sheath above the substrate.

The duty cycle of the two bias supplies may also be varied (while running the bias supplies 402 at the same voltages) to compensate for differing rates of processing rate due to non-uniformity effects in the plasma system. Or the bias supplies 402 may be run at different voltages or a combination of both different duty cycles and different voltages (between the bias supplies) to effect the desired processing uniformity. Additional sub divisions of buried electrical planes and corresponding bias supplies may also be utilized (e.g., two or more buried planes and corresponding bias supplies 402 can be implemented). While separate bias supplies 402 are shown, in practice, these could be integrated into one unit with a common DC voltage source but different outputs (e.g., a single DC power supply unit feeding two or more eV switches). Furthermore the output of the eV source could be split with a potential divider between the different buried electrical planes.

Figure 2:
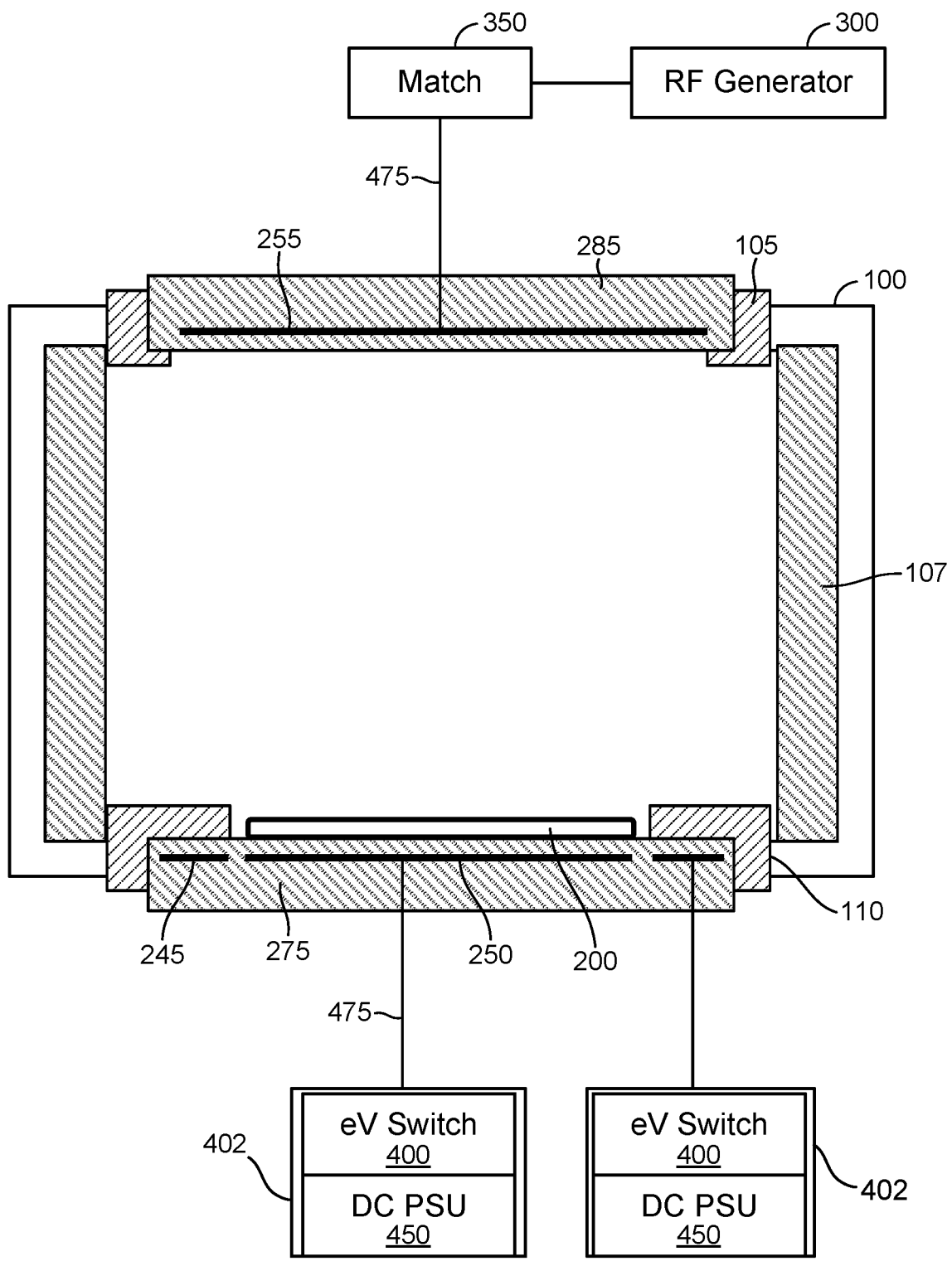
FIG. 2 depicts another plasma processing system with a plurality of bias zones.

FIG. 2 illustrates a further variation of the embodiment shown in FIG. 1. In this instance, rather than being arranged below an outer edge of the substrate 200, the outer buried electrode 245 is arranged at least partially beneath the isolator ring 110. This enables control of the bias and plasma sheath uniformity above the isolator ring 110. In some cases, the bias supply 402 imposed-bias can be controlled to either eliminate the RF plasma induced bias above the isolator ring 110 and avoid processing of the isolator ring 110 as a consumable of the process, or the opposite, to enhance plasma processing of the isolator ring 110.

Figure 3:
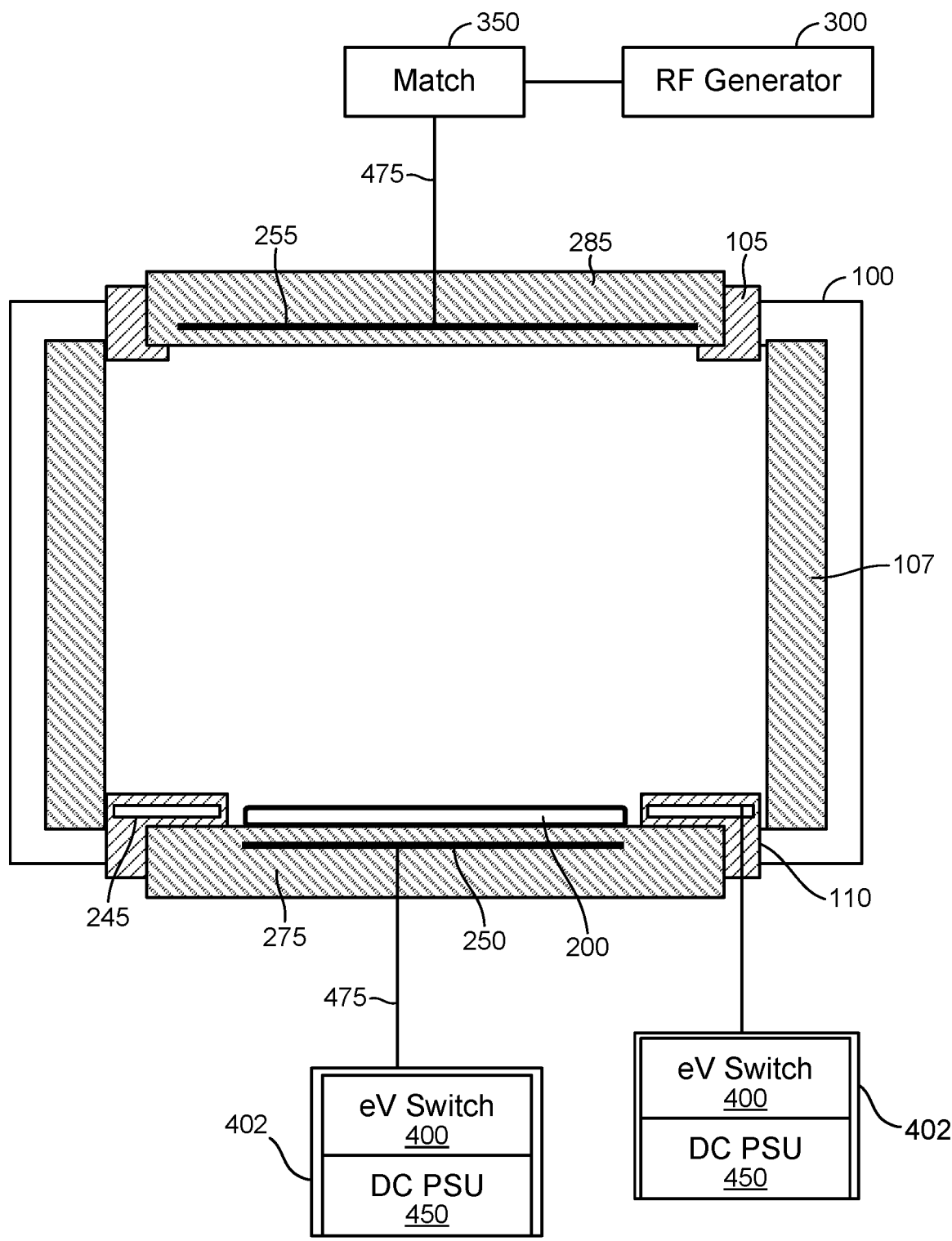
FIG. 3 depicts yet another plasma processing system with a plurality of bias zones.

FIG. 3 illustrates yet a further variation of the embodiment shown in FIG. 2. In this instance, the outer buried electrode 245 is inside the isolator ring 110, to control the bias and sheath uniformity above the isolator ring 110. In some cases, the bias-supply-imposed-bias can be controlled to either eliminate the RF-plasma-induced-bias and avoid processing of the isolator ring 110 as a consumable of the process, or the opposite, to enhance plasma processing of the isolator ring 110.

Figure 4:
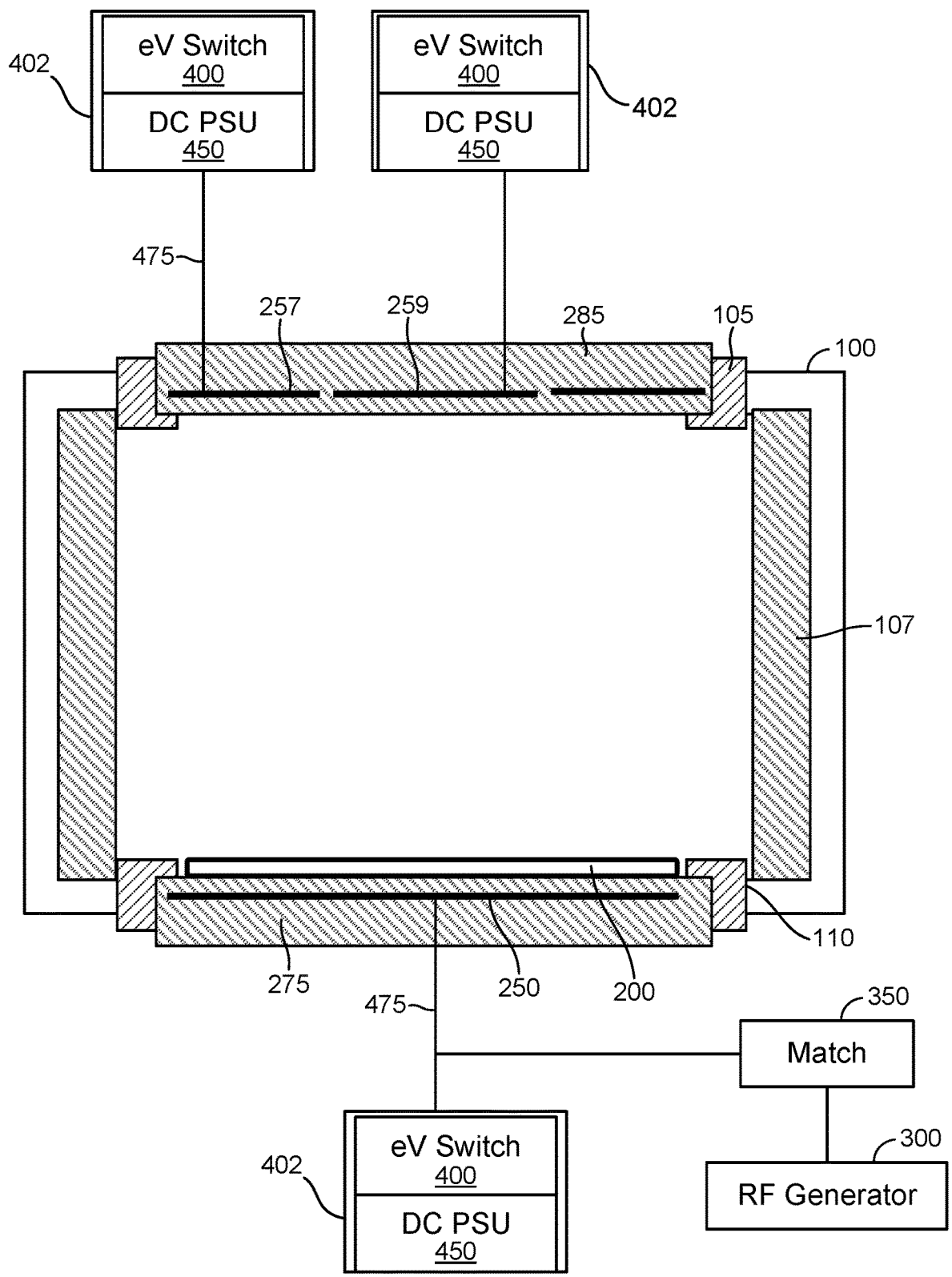
FIG. 4 depicts another plasma processing system with a plurality of bias zones.

FIG. 4 illustrates an embodiment where one or more bias supplies 402 are coupled to one or more top electrodes and one or more RF sources are coupled to the bottom electrode (through a match network 350) along with another one or more bias supplies 402. The filters that may be required to isolate the bias supply 402 and the source generator 300 are not shown, but can be implemented by those of skill in the art. By varying the duty cycles and/or voltage levels of the eV sources, the plasma uniformity can be altered and impact the processing uniformity of the substrate. The material of the top electrode 285 may be used in the processing of the substrate, hence by controlling the bias level(s) of the bias supplies 402, in amplitude, time, uniformity, or a combination of these, the uniformity and rate of substrate 200 processing may be controlled. There may be a desire to suppress the RF induced ion bias voltage above the surface of the top electrode 285, in which case the bias supplies 402 coupled to the electrical planes 257, 259 in the top electrode 285 can be used to cancel this bias voltage. If the RF induced voltage is nonuniform, then multiple bias supplies 402 (e.g., two or more bias supplies 402) can be used to counter these non-uniformities.

In another embodiment, one or more of the bias supplies 402 can be pulsed and/or have its voltage modulated, synchronously with pulsing and/or voltage changes of the source generator 300. For instance, during periods when one or more of the bias supplies 402 lowers a bias voltage from a first to a second bias voltage, the source generator 300 may pulse its output, lower its voltage, or both pulse and lower its voltage output.

These concepts should not be limited to the illustrated numbers of bias supplies 402 and source generators 300. Rather, many sources (e.g., many bias supplies 402 and many source generators 300) can be used, for instance, where complex, region-specific, control of plasma density (e.g., to achieve plasma density uniformity) is desired. It should also be understood that the number of sources need not match the number of electrodes. For instance, four source generators 300 can drive three electrodes, or two source generators can drive five electrodes, to give two non-limiting examples. Further, each source may have a corresponding match network, or a single match network may be coupled to and impedance match two or more sources. Where two or more electrodes are coupled to one or more bias supplies 402, these electrodes can be symmetric (e.g., concentric rings) or asymmetric (e.g., to account for asymmetries in the substrate and/or chamber).

Furthermore, where two or more bias 402 supplies are implemented, each bias supply can be used to determine a localized ion current (and hence ion energy and ion density) and localized sheath capacitance.

Ion current, $I_I$ may be given as:

$$I_I = C_1 \frac{dV_O}{dt} \qquad \text{(Equation 1)}$$

Where C1 represents the inherent capacitance of components associated with the chamber, which may include insulation, the substrate, substrate support, and an echuck.

Sheath capacitance, $C_{sheath}$, may be given as:

$$C_{sheath} = \frac{C_1 \cdot (I_I + I_C)}{I_C - C_1 \cdot \frac{dV_0}{dt}} \qquad \text{(Equation 2)}$$

Multiple bias supplies 402 and their corresponding ability to measure ion current, and hence, ion density at different locations within the chamber can be utilized as feedback for the bias supplies 402 and/or the source generators 300. And sheath capacitance may be calculated and utilized as a parameter value to control sheath capacitance and affect the plasma sheath. Alternatively, or in addition, this feedback can be used to control any electrical and/or mechanical feature of the processing chamber 100 or sources 300, 402. Alternatively, or in addition, this feedback can be used to control any one or more of the following: magnets of the plasma processing chamber 100 (e.g., magnets used to confine or shape the plasma, or magnets used to direct ions generated via a microwave plasma source); pressure control (e.g., pressure valves); mass flow control; gas flow control; gas chemistry control; and physical geometry of the chamber or components therein (e.g., vertical movement of the grounded silicon cap or lid). It will further be appreciated that in depth descriptions of the various known RF sources (e.g., capacitive, inductive, microwave, etc.) is not appropriate here because these are well-known in the art. However, the feedback and synchronization herein described is applicable to any known RF source.

Figure 5:
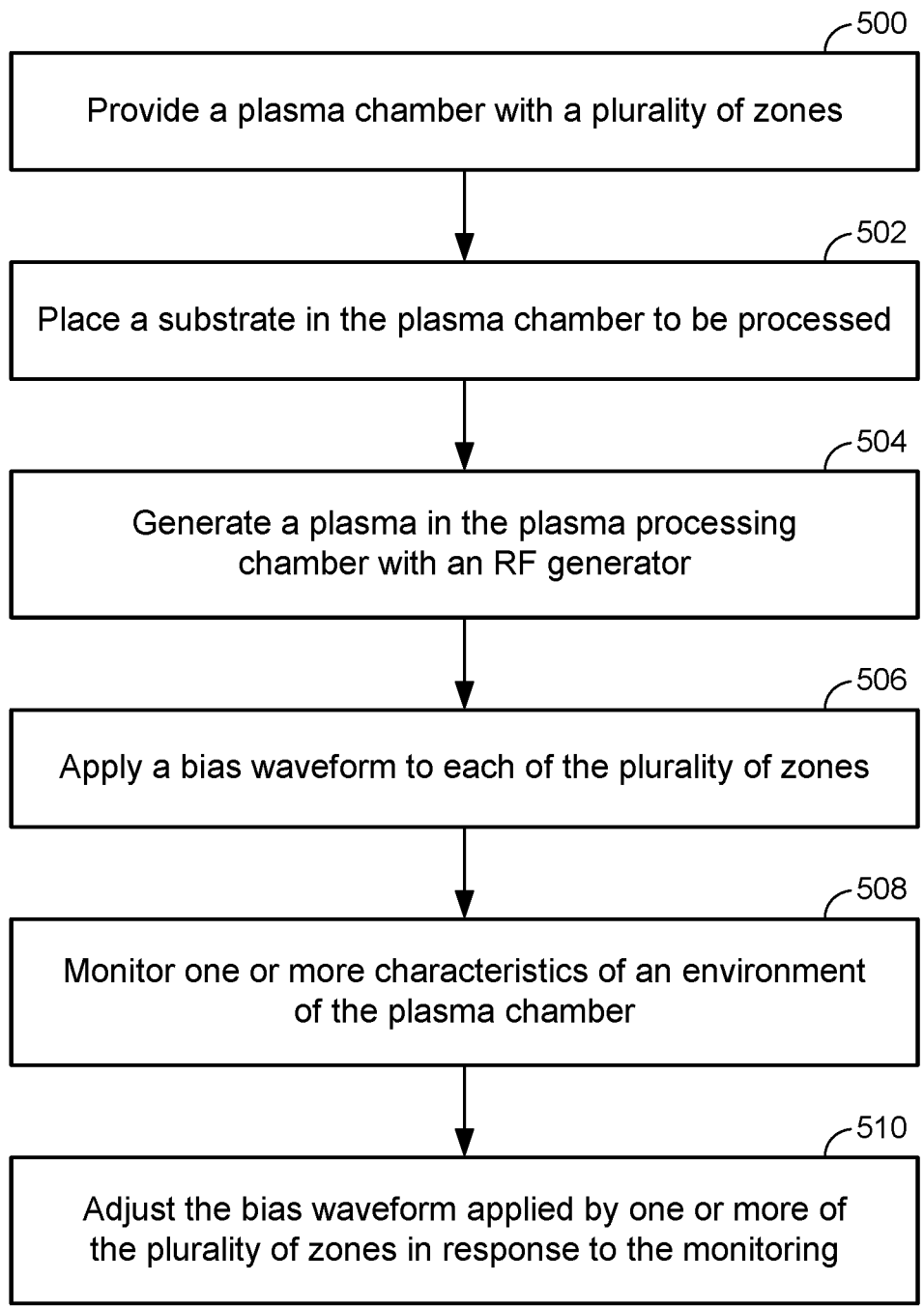
FIG. 5 is a flowchart depicting a method that may be traversed in connection with embodiments disclosed herein.

Referring next to FIG. 5, shown is a flowchart that depicts a method that may be traversed in connection with the several embodiments disclosed herein. The method includes providing a plasma processing chamber with a plurality of zones (Block 500). As described with reference to FIGS. 1-4, each of the zones may be realized in connection with a corresponding electrical plane. For example, each of the electrical planes 245, 249, 250, 257, 259 may establish a corresponding zone (when imparted with a periodic voltage waveform from a bias supply 402) to affect a portion of a sheath of the plasma established in the plasma processing chamber 100. In addition, the substrate 200 is placed in the plasma processing chamber 100 (Block 502) and a plasma is generated in the plasma processing chamber 100 with a source generator (Block 504). As shown, a bias waveform (e.g., an asymmetric periodic voltage waveform) is applied to each of the plurality of zones (Block 506), and one or more characteristics of an environment of the plasma processing chamber 100 are monitored (Block 508). The monitoring of the one or more characteristics may be implemented by sensors or probes within the plasma processing chamber, and/or by monitoring (outside of the plasma processing chamber) one or more aspects of the power applied by the bias supplies 402 or source generators 300. In response to the monitoring (Block 508), the bias waveform (e.g., asymmetric periodic voltage waveform) applied by one or more of the plurality of zones is adjusted (Block 510).

Figure 6:
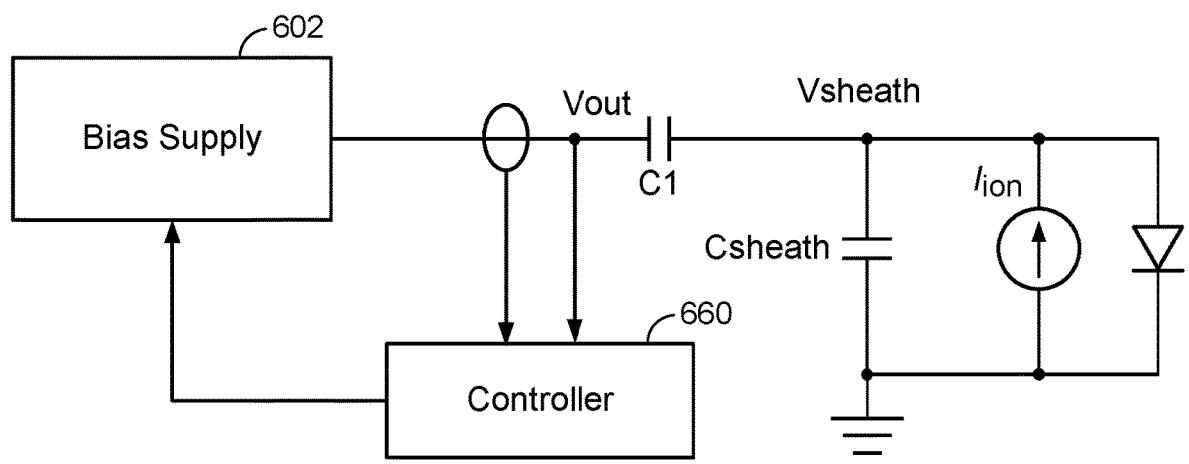
FIG. 6 is a diagram depicting aspects of an exemplary control system.

Referring to FIG. 6, shown are aspects of an exemplary control system that may be used in connection with embodiments herein. Also shown are representations of a sheath capacitance (Csheath) and a capacitance C1 that represents the inherent capacitance of components associated with the plasma processing chamber 100, which may include insulation, the substrate, substrate support, and an echuck.

As shown, current and/or voltage may be measured by the controller 660 to indirectly monitor one or more characteristics of an environment of the plasma processing chamber 100 (Block 508). An exemplary characteristic of the environment of the plasma processing chamber 100 may be sheath capacitance (Csheath), which may be calculated with Equation 2 using a measured output voltage, Vout.

The monitoring (Block 508) may be performed in advance of processing the substrate to obtain data (e.g., about sheath capacitance and/or other characteristics of the environment of the plasma processing chamber) that is stored, and then the data is utilized to adjust the bias waveform(s)(Block 510)(e.g., in a feed-forward manner). The monitoring at Block 508 may also be performed during plasma processing, and the adjustment at Block 510 (e.g., by adjusting voltage and/or duty cycle of the bias supply 602) may be made using real-time feedback using, for example, voltage and/or current measurements as shown in FIG. 6.

Figure 7:
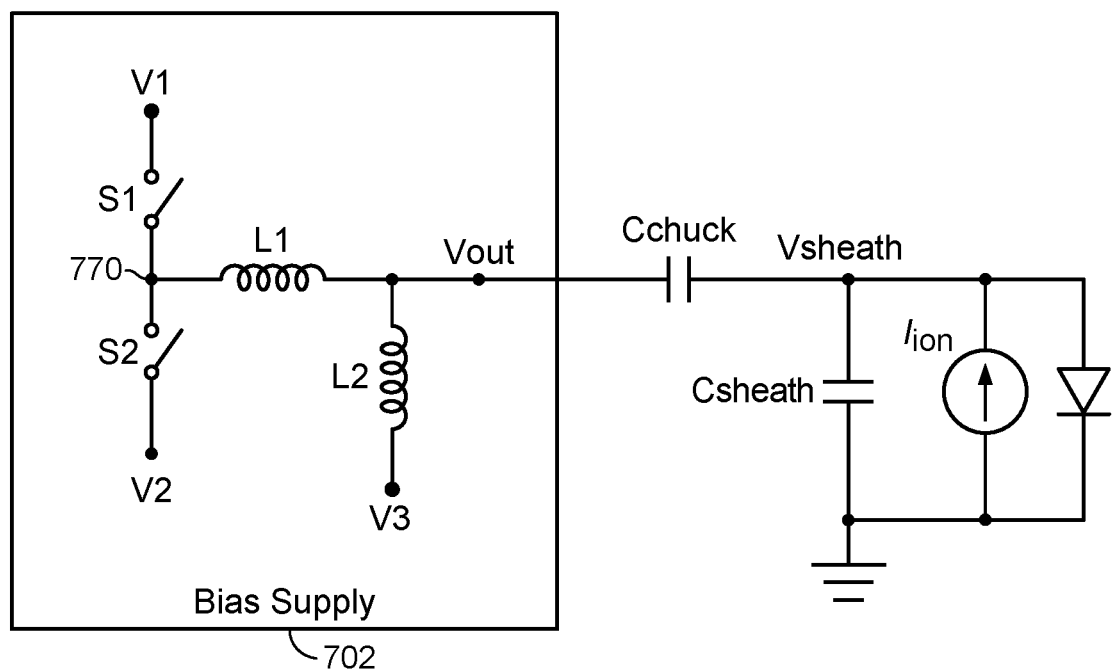
FIG. 7 is a diagram depicting aspects of an exemplary bias supply.

Referring next to FIG. 7, shown is a general representation of an exemplary bias supply 702 that may be used to realize the bias supplies 402, 602. As shown, the bias supply 702 utilizes three voltages V1, V2, and V3. Because the output, Vout, is capacitively coupled through Cchuck, it is generally not necessary to control the DC level of Vout and the three voltages can be reduced to two by choosing one of V1, V2 or V3 to be ground (0V). A separate chucking supply may be used so it is not necessary to control the DC level of Vout. If a separate chucking supply is not used, all three voltages can be controlled to control the DC level of Vout. Although not shown for clarity, the two switches S1, and S2 may be controlled by a switch controller via electrical or optical connection to enable the switch controller to open and close the switches, S1, S2, as disclosed below. The depicted switches S1, S2 may be realized by single pole, single throw switches, and as a non-limiting example, the switches S1, S2 may be realized by silicon carbide metal-oxide semiconductor field-effect transistors (SiC MOSFETs).

In this implementation, the voltages V1, V2, and V3 may be DC-sourced voltages. As shown, the first switch, S1, is disposed to switchably connect the first voltage, V1, to the output, Vout, through and inductive element and the second switch, S2, is disposed to switchably couple the second voltage, V2, to the output, Vout, through an inductive element. In this implementation the two switches connect to a common node, 670, and a common inductive element, L1, is disposed between the common node and an output node, Vout. Other arrangements of the inductive elements are possible. For example, there may be two separate inductive elements with one inductive element connecting S1 to Vout and another connecting S2 to Vout. In another example one inductive element may connect S1 to S2 and another inductive element may connect either S1 or S2 to Vout.

Figure 8:
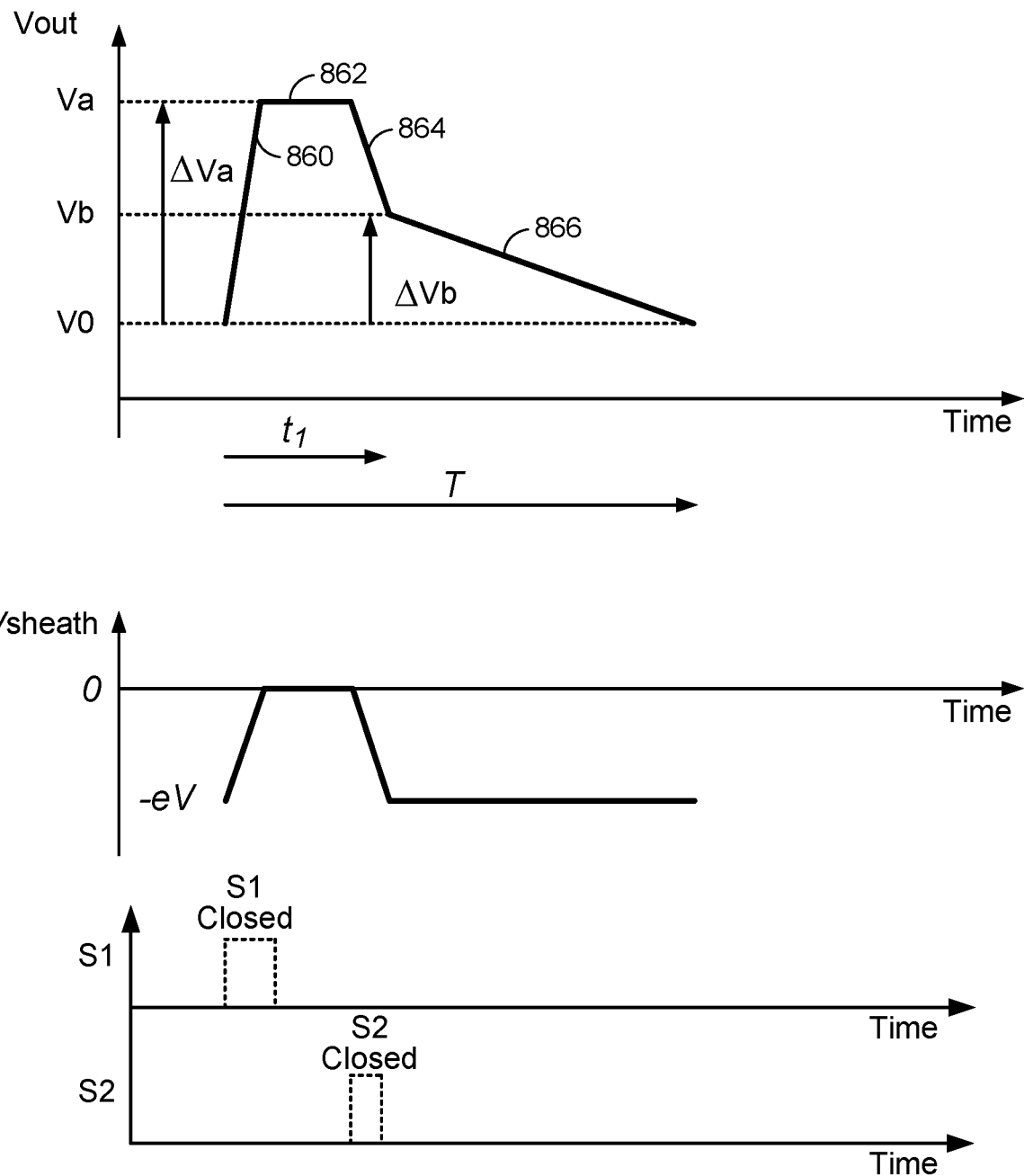
FIG. 8 includes a graph of a voltage waveform output from a bias supply; a graph of a corresponding sheath voltage; and a corresponding switch-timing diagram.

While referring to FIG. 7, simultaneous reference is made to FIG. 8, which depicts: 1) a cycle of the asymmetric periodic voltage waveform of the bias supply 702 that is output at Vout; 2) a corresponding sheath voltage; and 3) corresponding switch positions of switches S1 and S2. As shown, the periodic voltage waveform that is output by the bias supply 702 is asymmetric, so that a first half-cycle of the voltage waveform does not have a corresponding symmetrical component during a last half-cycle of the voltage waveform. In operation, the first switch, S1, is closed momentarily to increase, along a first portion 860 of the voltage waveform (between voltage V0 and Va) a level of the voltage at the output node, Vout, to a first voltage level, Va. The level Va is maintained along a second portion 862 of the waveform. The second switch, S2, is then closed momentarily to decrease, along a third portion 864 of the waveform, the level of the voltage waveform at the output node, Vout, to a second voltage level, Vb. Note that S1 and S2 are open except for short periods of time. As shown, the negative voltage swing along the third portion 864 affects the sheath voltage (Vsheath); thus, a magnitude of Va-Vb may be controlled to affect the sheath voltage.

In this embodiment, while the first and second switches S1, S2 are open, the third voltage, V3, is applied to the output node, Vout, through a second inductive element L2 to further decrease a level of the voltage at the output node along a fourth portion 866 of the voltage waveform. As shown in FIG. 8, the negative voltage ramp along the fourth portion 866 may be established to maintain the sheath voltage by compensating for ions that impact the substrate.

Thus, S1 momentarily connects and then disconnects the first voltage, V1, to the output, Vout, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output Vout causes the voltage of the output, Vout, to increase along the first portion 860 of the voltage waveform to a first voltage level, Va, and the first voltage level, Va, is sustained along the second portion of the waveform 862. The first voltage level Va may be above the first voltage, V1, and the second voltage, V2, (e.g., ground) may be less than the first voltage level, Va. The momentary connecting and then disconnecting of the second voltage, V2, causes the voltage of the output to decrease at the third portion 864 to the second voltage level Vb that is below the second voltage, V2 (e.g., ground).

Figure 9:
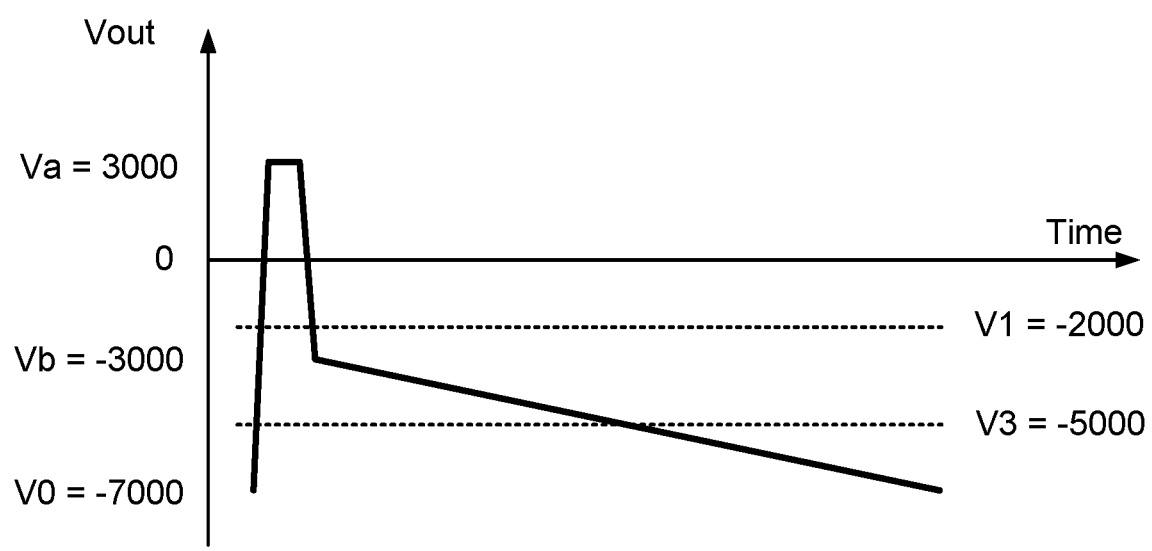
FIG. 9 is a graph depicting an exemplary bias supply waveform and exemplary voltage values.

As an example, as shown in FIG. 9, V1 may be −2000 VDC; V2 may be ground; V3 may be −5000 VDC; V0 may be −7000 VDC; Vb may be −3000 VDC; and Va may be 3000 VDC. But these voltages are merely exemplary to provide context to relative magnitude and polarities of the voltages described with reference to FIGS. 7 and 8.

Figure 10A:
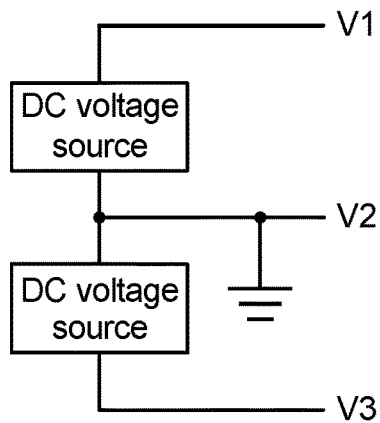
FIG. 10A depicts an implementation using two voltage sources to provide voltages to the bias supply depicted in FIG. 7.
Figure 10B:
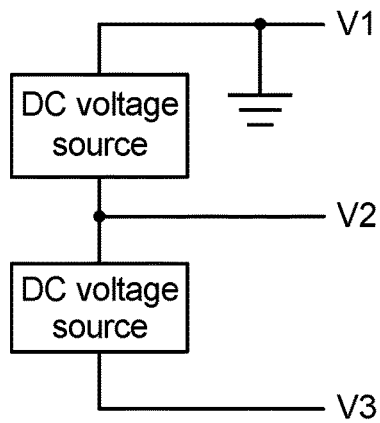
FIG. 10B depicts another implementation using two voltage sources to provide voltages to the bias supply depicted in FIG. 7.
Figure 10C:
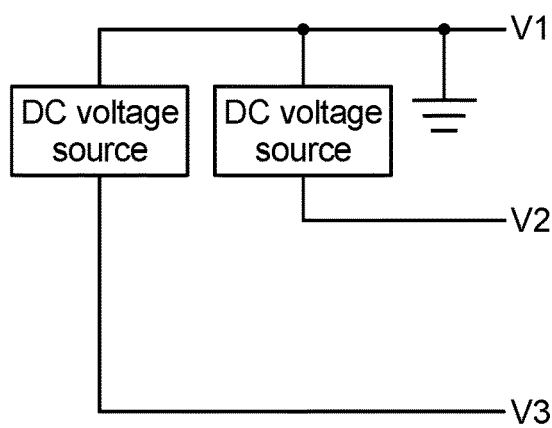
FIG. 10C depicts yet another implementation using two voltage sources to provide voltages to the bias supply depicted in FIG. 7.

Referring next to FIGS. 10A-10C shown are possible arrangements of two DC voltage sources to provide the voltages V1, V2, and V3 depicted in FIGS. 7 and 9. In FIG. 10A, V2 is grounded and forms a common node between the two DC voltage sources. In FIG. 10B, V1 is grounded and V2 forms a common node between the DC voltage sources. And in FIG. 10C, V1 is grounded and forms a common node between each of the two DC voltage sources.

Figure 11A:
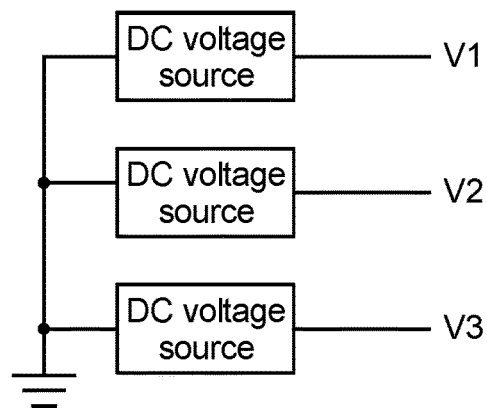
FIG. 11A depicts an implementation using three voltage sources to provide voltages to the bias supply depicted in FIG. 7.
Figure 11B:
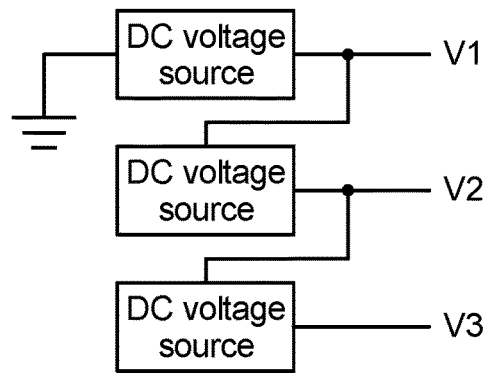
FIG. 11B depicts another implementation using three voltage sources to provide voltages to the bias supply depicted in FIG. 7.
Figure 11C:
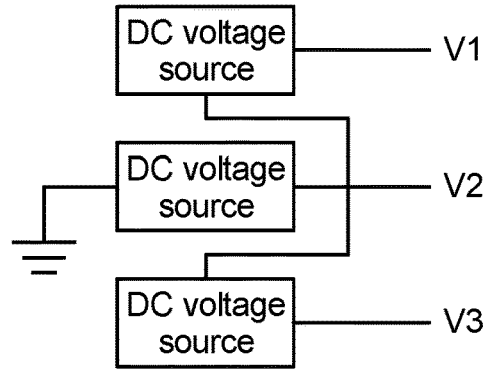
FIG. 11C depicts yet another implementation using three voltage sources to provide voltages to the bias supply depicted in FIG. 7.

In some embodiments, as shown in FIGS. 11A, 11B, and 11C, three DC voltage sources may be utilized to apply the three voltages V1, V2, and V3. As shown in FIG. 11A, each of the three DC voltage sources may be coupled to ground, and each of the three DC voltage sources provides a corresponding one of V1, V2, V3. In FIG. 11B one of the DC voltages sources is grounded and the three DC voltage sources are arranged in series. In FIG. 11C, one of DC voltages sources is disposed between ground and V2, and each of the DC voltage sources is coupled to V2.

Figure 12:
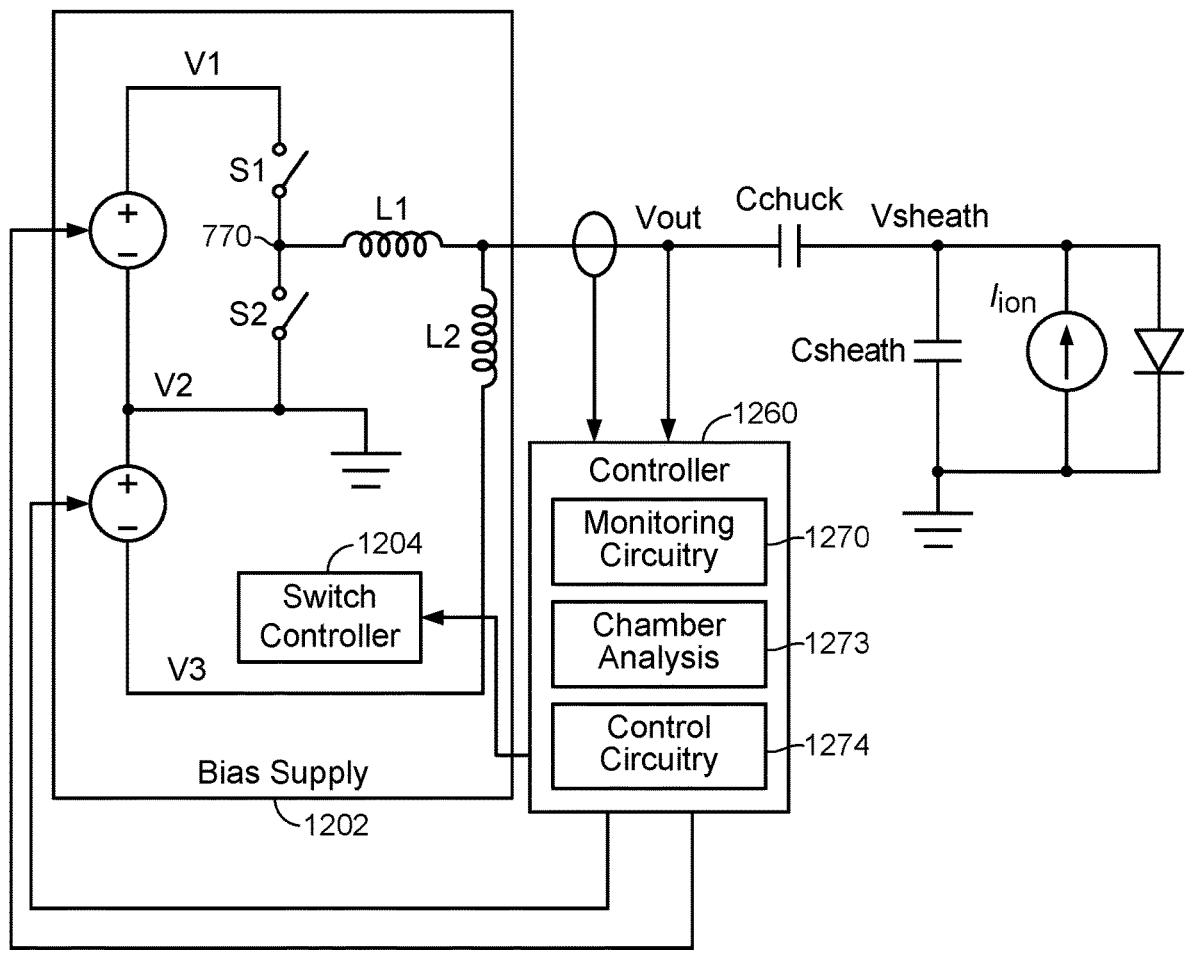
FIG. 12 is a diagram depicting aspects of an exemplary bias supply in connection with a control system.

Referring next to FIG. 12, shown is an exemplary bias supply 1202 that may be used to realize the bias supplies 402, 602. As shown, the bias supply 1202 includes a switch controller 1204 and two voltage sources to provide a first voltage V1, a second voltage V2, and a third voltage V3. Although not shown for clarity, the two switches S1, and S2 are coupled to the switch controller 1204 (e.g., via electrical or optical connection) to enable the switch controller 1204 to open and close the switches, S1, S2, as disclosed below. The depicted switches S1, S2 may be realized by single pole, single throw, normally open switches that are controllable by electrical or optical signal. As a non-limiting example, the switches S1, S2 the switches S1, S2 may be realized by silicon carbide metal-oxide semiconductor field-effect transistors (SiC MOSFETs).

Also shown is an exemplary controller 1260 that may be realized within a housing of each bias supply or may be realized as a part of a centralized tool controller. As shown, the controller 1260 is coupled to receive information (e.g., voltage and/or current information) indicative of the power applied by the bias supply 1202 at the output, Vout, of the bias supply. As shown, the controller 1260 is also coupled to the switch controller 1204 and the two DC voltage sources to enable the controller 1260 to control the bias supply 1202 (e.g., to control the plasma sheaths proximate to the bias electrodes).

In addition, the controller 1260 includes monitoring circuitry 1270 to measure at least one characteristic of the power that is applied by the bias supply 1202, and a chamber analysis component 1272 configured to calculate a characteristic of an environment within the plasma processing chamber 100 based upon the measured characteristic of the power obtained from the monitoring circuitry 1270. Also shown in the controller 1260 is control circuitry 1274 to adjust the power applied by the bias supply 1202 to control the plasma sheaths proximate to the bias electrodes. In FIG. 12, the controller 1260 and switch controller 1204 are depicted as separate constructs, but it should be recognized that the controller 1260 and switch controller 1204 may be integrated and/or share common underlying components. For example, the controller 1260 and switch controller 1204 may be collocated on the same printed circuit board. As another example, the controller 1260 and switch controller may be realized by a system that includes an architecture similar to, or the same as, the computing device depicted in FIG. 13.

The monitoring circuitry 1270 may include one or more sensors such as a directional coupler, V-I sensor, phase and gain sensor, voltage sensor, and a current sensor. As one of ordinary skill in the art will appreciate, the measured characteristic of power may include, voltage, current, phase, and power. In addition, the monitoring circuitry 1270 may include analog-to-digital conversion components to convert analog signals from the sensor(s) to digital representations of the measured characteristic of the power. In other implementations, the sensor(s) are separate from the controller 1260, and the monitoring circuitry 1270 includes analog-to-digital conversion components to convert analog signals from the sensor(s) to digital representations of the measured characteristic of the power. In yet other implementations, the sensor(s) include sensing elements and analog-to-digital conversion components, and the monitoring circuitry 1270 may receive the digital representation of the characteristic of the power. The monitoring of one or more characteristics of the environment of the plasma processing chamber may include measuring (with the monitoring circuitry 1270) at least one characteristic of the power that is applied by the at least one bias supply.

The chamber analysis component 1272 is generally configured to determine a characteristic of an environment within the plasma processing chamber based upon the measured characteristic of the power obtained from the monitoring circuitry 1270. Although power may be measured (by the monitoring circuitry 1270) at a location that is exterior to the plasma processing chamber 100, the measured power characteristic may be used to calculate the characteristic of an environment within the plasma processing chamber 100. For example, using Equation 1, ion current in a region proximate to a bias zone may be calculated using measurements of voltage at Vout in connection with C1. As another example, using Equation 2, sheath capacitance in a region proximate to a bias zone may be calculated.

The control circuitry 1274 generally operates to adjust the power applied by the bias supply to adjust an aspect of the environment within the plasma processing chamber 100. For example, the plasma sheath proximate to a zone (established by the bias supply 1202) may be adjusted, and/or ion current may also be adjusted. As shown, the controller 1260 may be coupled to the DC voltage sources and the switch controller 1204; thus, with reference to FIG. 8, the controller 1260 may be used to adjust the voltage, Va, the voltage Vb, t1, T, and the slope of the fourth portion 866. As discussed with reference to FIG. 8, the voltage of the plasma sheath in proximity to a bias zone associated with the bias supply 1202 may be adjusted.

Referring again to FIG. 12, in this implementation (which incorporates the embodiment depicted in FIG. 10A), the second voltage, V2, is provided at a node that is coupled to two DC voltage sources and coupled to ground, but in other implementations (e.g., described above with reference to FIGS. 10B and 10C) the second voltage, V2, need not be ground. As shown, the first switch, S1, is disposed to switchably connect the first voltage, V1, to the common node 770 (that is common to S1 and S2), and the second switch, S2, is disposed to switchably couple the second voltage, V2, to the common node 770. In addition, the first inductive element, L1, is disposed between the common node and an output node, Vout.

In operation, the switch controller 1204 is configured close the first switch, S1, to increase, along a first portion 860 of the voltage waveform (between a voltage $V_0$, and Va) a level of the voltage at the output node, Vout, to a first voltage level, Va, that is maintained along the second portion 862 of the waveform, and then the first switch, S1, is opened. The switch controller 1204 then closes the second switch, S2, to decrease, along a third portion 864 of the waveform, the level of the voltage waveform at the output node, Vout, to a second voltage level, Vb, and then the switch controller 704 opens the second switch, S2, so that S1 and S2 are open. As shown, the negative voltage swing along the third portion 864 affects the sheath voltage (Vsheath); thus, a magnitude of Vb may be controlled to affect the sheath voltage in close proximity to the electrode plane coupled to Vout. Those of skill in the art will appreciate that Vb is controllable by controlling V1, but Vb is not equal to V1 by virtue of the effect of the inductor, L1, in this implementation.

In this embodiment, the second voltage source functions as an ion compensation component to apply, at least while the first and second switches S1, S2 are open, the third voltage, V3, to the output node, Vout, through a second inductive element L2 to further decrease a level of the voltage waveform at the output node along a fourth portion 866 of the periodic asymmetric voltage waveform. As shown in FIG. 8, the negative voltage ramp along the fourth portion 866 may be established to maintain the sheath voltage by compensating for ions that impact the substrate.

Thus, S1 momentarily connects and then disconnects the first voltage, V1, to the output, Vout, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output Vout causes the voltage of the output, Vout, to increase along the first portion 860 of the voltage waveform to a first voltage level, Va, and the first voltage level, Va, is sustained along the second portion of the waveform 862. The first voltage level Va may be above the first voltage, V1, and the second voltage, V2, (e.g., ground) may be less than the first voltage level, Va. The momentary connecting and then disconnecting of the second voltage, V2, causes the voltage of the output to decrease at the third portion 864 to the second voltage level Vb that is below the second voltage, V2 (e.g., ground).

In an embodiment, one or more bias supplies may be used to measure ion density, sheath capacitance, or other chamber parameters with a reference substrate or no substrate in the chamber. One or more processing runs could be carried out, and then the measurements can be repeated. In this way, changes to the chamber can be monitored.

If a silicon top lid is used, then one or more bias supplies 402, 602, 702, 1202 can be used to monitor regional ion density and/or other chamber parameters. A silicon top lid (also referred to as a silicon vacuum seal) is typically consumable but may not be consumed in uniform manner. Using multiple bias supplies 402, 602, 702, 1202 to measure regional plasma characteristics may provide a means to infer non-uniform changes in the silicon vacuum seal. This feedback over time can be used to adjust RF source(s) 300 and/or bias supplies 402, 602, 702, 1202 to account for time varying non-uniformities in the silicon vacuum seal. Additionally, this feedback can be used to determine when the silicon vacuum seal may be due for replacement. In another embodiment, one or more bias supplies 402, 602, 702, 1202 can be coupled to an electrode adjacent to this silicon vacuum seal (e.g., at a top of the chamber). Since a bias supply 402, 702, 1202 can be used to modify or even eliminate the plasma sheath, this top-mounted bias supply 402, 602, 702, 1202 could be used to minimize or even eliminate a plasma sheath between the silicon vacuum seal and the plasma. In this way, erosion or consumption of the silicon vacuum seal can be reduced as compared to current processes.

Along these lines, each bias supply 402, 602, 702, 1202 and corresponding electrode could be arranged at various locations of the processing chamber in order to locally control plasma sheaths and thereby reduce or eliminate ion bombardment for certain regions or components of the chamber. Ion density and sheath capacitance, and local variations thereof, may be used to monitor chamber cleanliness. For instance, changes in local ion density over time may indicate that a local chamber surface has accumulated one or more films. In another embodiment, multiple electrostatic chuck voltages distributed in space could be used to influence regional ion density.

Figure 13:
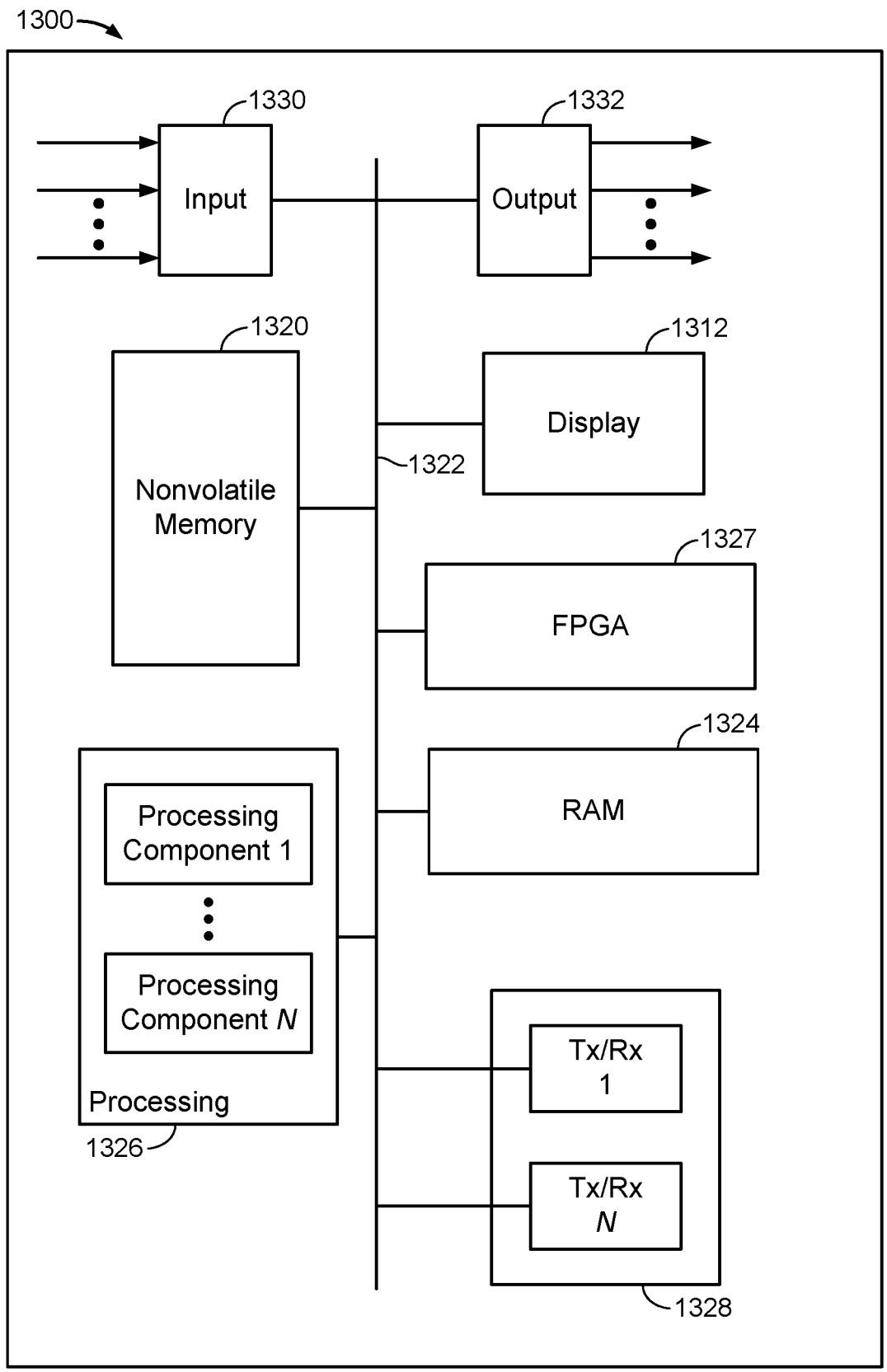
FIG. 13 is a block diagram depicting an exemplary computing device.

The methods described in connection with the embodiments disclosed herein may be embodied directly in hardware, in processor-executable code encoded in a non-transitory tangible processor readable storage medium, or in a combination of the two. Referring to FIG. 13 for example, shown is a block diagram depicting physical components that may be utilized to realize control aspects of the source generator 300, and the bias supplies 402, 602, 702, 1202 according to an exemplary embodiment. As shown, in this embodiment a display portion 1312 and nonvolatile memory 1320 are coupled to a bus 1322 that is also coupled to random access memory ("RAM") 1324, a processing portion (which includes N processing components) 1326, a field programmable gate array (FPGA) 1327, and a transceiver component 1328 that includes N transceivers. Although the components depicted in FIG. 13 represent physical components, FIG. 13 is not intended to be a detailed hardware diagram; thus, many of the components depicted in FIG. 13 may be realized by common constructs or distributed among additional physical components. Moreover, it is contemplated that other existing and yet-to-be developed physical components and architectures may be utilized to implement the functional components described with reference to FIG. 13.

This display portion 1312 generally operates to provide a user interface for a user, and in several implementations, the display is realized by a touchscreen display. In general, the nonvolatile memory 1320 is non-transitory memory that functions to store (e.g., persistently store) data and processor-executable code (including executable code that is associated with effectuating the methods described herein). In some embodiments for example, the nonvolatile memory 1320 includes bootloader code, operating system code, file system code, and non-transitory processor-executable code to facilitate the execution of a method of biasing different localized regions of the substrate or plasma processing chamber 100 as described with reference to relative to FIGS. 1-12. One or more of the monitoring circuitry 1270, chamber analysis component 1272 and control circuitry 1272 may be realized, at least in part, by the non-transitory processor-executable code.

In many implementations, the nonvolatile memory 1320 is realized by flash memory (e.g., NAND or ONENAND memory), but it is contemplated that other memory types may be utilized as well. Although it may be possible to execute the code from the nonvolatile memory 1320, the executable code in the nonvolatile memory is typically loaded into RAM 1324 and executed by one or more of the N processing components in the processing portion 1326.

The N processing components in connection with RAM 1324 generally operate to execute the instructions stored in nonvolatile memory 1320 to enable execution of the algorithms and functions disclosed herein. It should be recognized that several algorithms are disclosed herein, but some of these algorithms are not represented in flowcharts. Processor-executable code to effectuate methods of biasing different localized regions of the substrate or chamber as shown in and described relative to FIGS. 1-12 may be persistently stored in nonvolatile memory 1320 and executed by the N processing components in connection with RAM 1324. As one of ordinarily skill in the art will appreciate, the processing portion 1326 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in nonvolatile memory 1320 and accessed (e.g., during boot up) to configure a field programmable gate array (FPGA) to implement the algorithms disclosed herein and to effectuate one or more of the functions of the controller 1260 or other aspects of the RF sources 300 and bias supplies. 402, 602, 702, 1202.

The input component 1330 operates to receive signals (e.g., current, voltage, and phase information and/or a synchronization signal between bias supplies and the source generator) that are indicative of one or more aspects of an environment within the plasma processing chamber 100 and/or synchronized control between a source generator 300 and the bias supplies 402, 602, 702, 1202. The signals received at the input component may include, for example, the synchronization signals, power control signals to the various generators and power supply units, or control signals from a user interface. The output component generally operates to provide one or more analog or digital signals to effectuate an operational aspect of controlling the bias supplies (e.g., localized biasing of the substrate and/or other components within the plasma processing chamber 100) as disclosed herein and/or signal(s) to effect synchronization between the RF source and the bias supplies. For example, the output portion 1332 may provide a synchronization signal between the bias supplies 402, 602, 702, 1202 the source generator 300.

The depicted transceiver component 1328 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A system for plasma processing, the system comprising:
   a processing chamber comprising a first electrical plane proximate to an inner zone in the processing chamber and a second electrical plane proximate to an outer zone in the processing chamber;
   a first bias supply to provide a first asymmetric periodic voltage waveform to the first electrical plane;
   a second bias supply to provide a second asymmetric periodic voltage waveform to the second electrical plane;
   a controller to adjust one or more characteristics of the asymmetric periodic voltage waveforms to alter corresponding portions of a plasma sheath.

2. The system of claim 1, wherein the first electrical plane and the second electrical plane are concentric electrical planes.

3. The system of claim 2 wherein the second electrical plane is positioned at an edge of a substrate holder.

4. The system of claim 3, wherein the second electrical plane is embedded in an isolating ring.

5. The system of claim 4, whereon the second electrical plane is positioned below an isolating ring.

6. The system of claim 1, comprising:
   at least one of a remote plasma source or a source generator to provide a plasma in the processing chamber; and
   a chuck disposed to support a substrate and positioned between a sheath of the plasma and the electrical planes to enable the electrical planes to alter a portion of the sheath affecting at least one of a trajectory of ions or spatial distribution of energies of ions relative to the substrate.

7. The system of claim 1, wherein the controller includes:
   monitoring circuitry to measure at least one characteristic of the power that is applied by at least one of the bias supplies;
   a chamber analysis component configured to determine a characteristic of an environment within the processing chamber based upon the at least one measured characteristic of the power obtained from the monitoring circuitry; and control circuitry to adjust the power applied by the at least one bias supply to control a portion of the plasma sheath.

8. The system of claim 7, wherein the controller includes at least one of an integrated controller that is integrated within the at least one bias supply or a system controller that controls multiple components.

9. A method for processing a substrate in a plasma processing chamber, the method comprising:
producing a plasma in the plasma processing chamber;
applying a first asymmetric periodic voltage waveform to an inner zone in the plasma processing chamber with a first bias supply; and
applying a second asymmetric periodic voltage waveform to an outer zone in the plasma processing chamber with a second bias supply; and
adjusting one or more characteristics of the asymmetric periodic voltage waveforms to alter corresponding portions of a plasma sheath.

10. The method of claim 9, wherein applying the second asymmetric periodic voltage waveform to the outer zone includes applying the second asymmetric periodic voltage waveform to a zone that corresponds to an edge of the substrate.

11. The method of claim 10, including applying the second asymmetric periodic voltage waveform to the zone that corresponds to the edge of the substrate to suppress a density of the plasma that is proximate to the edge of the substrate.

12. The method of claim 9, including coupling at least one source generator and one of the bias supplies to a common electrode.

13. The method of claim 9, including applying an asymmetric periodic voltage waveform to one or more top zones to alter corresponding one or more portions of a plasma sheath that are proximate to a top plate of the plasma processing chamber.

14. The method of claim 9 including:
measuring a characteristic of each of the asymmetric periodic voltage waveforms that are applied by the bias supplies;
calculating a characteristic of an environment within the plasma processing chamber based upon the measured characteristic; and
adjusting, based on the characteristic of the environment within the plasma processing chamber, the asymmetric periodic voltage waveforms to alter the plasma sheath.

15. A non-transitory computer-readable medium comprising instructions stored thereon, for execution by a processor, or for configuring a field programmable gate array, to perform plasma processing, the instructions including instructions to:
control at least one of a remote plasma source or a source generator to produce a plasma in a plasma processing chamber;
control a plurality of bias supplies to apply an asymmetric periodic voltage waveform to each of a plurality of zones in the plasma processing chamber; and
control one or more of the plurality of bias supplies to adjust one or more characteristics of the asymmetric periodic voltage waveforms to alter corresponding portions of a plasma sheath.

16. The non-transitory computer-readable medium of claim 15, wherein the instructions comprise instructions to:
measure a characteristic of the asymmetric periodic voltage waveform that is applied by one or more of the bias supplies to one or more of the zones;
calculate a characteristic of an environment within the plasma processing chamber based upon the measured characteristic; and
adjust the asymmetric periodic voltage waveform applied by the at least one bias supply to control the plasma sheaths proximate to the one or more zones.

17. The system of claim 1, wherein the outer zone corresponds to an edge of a substrate.

18. The system of claim 17 wherein the controller is configured to apply the second asymmetric periodic voltage waveform to suppress a density of the plasma that is proximate to the edge of the substrate.

19. The system of claim 1 comprising a source generator coupled to a common node with one of the bias supplies.

20. The system of claim 1, wherein the first bias supply is configured to:
measure ion current proximate to the first electrical plane; and
control the first asymmetric periodic voltage waveform based upon the measured ion current proximate to the first electrical plane.

* * * * *